United States Patent
Asami

(10) Patent No.: US 7,471,221 B2
(45) Date of Patent: *Dec. 30, 2008

(54) ANALOG/DIGITAL CONVERTER AND PROGRAM THEREFOR

(75) Inventor: Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 387 days.

This patent is subject to a terminal disclaimer.

(21) Appl. No.: 11/358,452

(22) Filed: Feb. 21, 2006

(65) Prior Publication Data

US 2006/0267814 A1  Nov. 30, 2006

Related U.S. Application Data

(62) Division of application No. 11/138,651, filed on May 26, 2005, now Pat. No. 7,292,166.

(51) Int. Cl.
*H03M 1/00* (2006.01)
(52) U.S. Cl. ...................... 341/122; 341/155
(58) Field of Classification Search .......... 341/115–170
See application file for complete search history.

(56) References Cited

U.S. PATENT DOCUMENTS

| 4,621,286 | A | * | 11/1986 | Reitmeier et al. | 375/240.01 |
|---|---|---|---|---|---|
| 5,294,926 | A | * | 3/1994 | Corcoran | 341/120 |
| 6,058,121 | A | * | 5/2000 | Kim et al. | 370/480 |
| 6,130,922 | A | * | 10/2000 | Stott et al. | 375/344 |
| 6,160,508 | A | * | 12/2000 | Gustavsson et al. | 341/155 |
| 6,473,013 | B1 | * | 10/2002 | Velazquez et al. | 341/120 |
| 6,701,297 | B2 | * | 3/2004 | Main | 704/500 |
| 6,836,235 | B2 | * | 12/2004 | Asami | 341/155 |
| 6,915,225 | B2 | * | 7/2005 | Jorgensen | 702/77 |
| 7,119,724 | B1 | * | 10/2006 | Asami | 341/118 |

* cited by examiner

*Primary Examiner*—Lam T Mai
(74) *Attorney, Agent, or Firm*—Osha • Liang LLP

(57) ABSTRACT

An analog-to-digital conversion apparatus includes an interleaving unit operable to align the digital data respectively output from the plurality of analog-to-digital conversion units; and a correction arithmetic unit operable to correct a data value error of a data sequence caused by an error of a frequency characteristic for each of the plurality of analog-to-digital conversion units. The correction arithmetic unit includes a data partitioning unit that partitions the data sequence into a plurality of partition data having a predetermined partition data number and respectively generates the partition data; an arithmetic unit that sequentially acquires the partition data and sequentially outputs data after correction made by sequentially performing correction arithmetic; and a data connecting unit that removes either of the duplicated data according to each partition data or the duplicated data and sequentially connects the data after correction.

4 Claims, 15 Drawing Sheets

ANALOG/DIGITAL CONVERTER AND PROGRAM THEREFOR

CROSS-REFERENCE TO RELATED APPLICATIONS

This is a divisional of U.S. patent application Ser. No. 11/138,651 filed on May 26, 2005.

BACKGROUND OF THE INVENTION

1. Field of the Invention

The present invention relates to an analog-to-digital conversion apparatus that corrects digital data output from a plurality of analog-to-digital conversion units and a program therefor.

2. Description of Related Art

Conventionally, in case of converting an analog signal into an digital signal, there is known an N-phase (N-way) interleaved analog-to-digital conversion method using N analog-to-digital converters (hereinafter, referred to as ADCs) in order to raise a sampling rate apparently.

However, in the interleaved analog-to-digital conversion method as described above, when some errors are observed in phases of sampling clocks being supplied to each of ADCs and a frequency characteristic of each of ADCs, a frequency spectrum of a digital signal cannot be computed with high precision.

For example, phases of sampling clocks being supplied to each of ADCs have to be different from one another by a predetermined phase. However, it is difficult to move a phase of each of sampling clocks by a predetermined phase precisely. Moreover, although sampling clocks are supplied to each of ADCs with a precise phase, when a frequency characteristic of ADC is not ideal, a variation is observed in sampling timing and a gain in each of ADCs and thus it is difficult to compute a frequency spectrum of a digital signal with high precision.

For this reason, it is necessary to correct the sampled digital signal according to a frequency characteristic of each ADC. For example, a method for correcting a spectrum transformed from the digital signal by way of discrete Fourier transform according to a frequency characteristic of each ADC is considered.

In this case, an arithmetic unit that conducts discrete Fourier transform and correction arithmetic sequentially acquires digital signal data by a predetermined data number and performs arithmetic processing. However, since the digital signal data are separately processed, there has been a problem that it is not possible to hold a continuity of a waveform of a digital signal.

Therefore, it is an object of the present invention to provide an analog-to-digital conversion apparatus and a program that can solve the foregoing problems. The above and other objects can be achieved by combinations described in the independent claims. The dependent claims define further advantageous and exemplary combinations of the present invention.

SUMMARY OF THE INVENTION

To solve this problem, according to the first aspect of the present invention, there is provided an analog-to-digital conversion apparatus to which an analog signal is divergingly supplied and which corrects digital data output from a plurality of analog-to-digital conversion units that sequentially converts the analog signal in different timing by a predetermined phase. The analog-to-digital conversion apparatus includes: an interleaving unit operable to align the digital data respectively output from the plurality of analog-to-digital conversion units according to the timing in which the digital data are respectively converted and to generate a data sequence; and a correction arithmetic unit operable to correct a data value error of the data sequence caused by a phase error of the timing, in which the plurality of analog-to-digital conversion units samples the analog signal, based on a frequency characteristic of each of the analog-to-digital conversion units, in which the correction arithmetic unit includes: a data partitioning unit that generates a plurality of partition data by partitioning the data sequence by a predetermined partition data number; a data inserting unit that inserts data with data value zero at the head or end of each of the partition data by a predetermined insertion data number to sequentially output these data; an arithmetic unit that sequentially acquires the partition data sequentially output from the data inserting unit and sequentially outputs data after correction made by sequentially performing correction arithmetic according to the frequency characteristic of each analog-to-digital conversion unit with respect to the acquired partition data; and a data connecting unit that adds the data of the insertion data number at the end of each data after correction sequentially output from the arithmetic unit according to each partition data and the data of the insertion data number at the head of the data after correction following that data after correction in order to sequentially connect that data after correction and the data after correction following that data after correction.

The data partitioning unit may generate the plurality of partition data using a value, which is obtained by subtracting the insertion data number from the number of process data sequentially acquired by the arithmetic unit, as the partition data number.

The correction arithmetic unit may further include: a characteristic storing unit that previously stores a frequency characteristic of the analog-to-digital conversion unit; a Fourier inverse transform unit that converts the frequency characteristic of the analog-to-digital conversion unit into a discrete signal on a time axis and inputs the signal to the data partitioning unit; a Fourier transform unit that converts the signal output from the data connecting unit into a signal on a frequency axis when the Fourier inverse transform unit inputs the discrete signal to the data partitioning unit; an error computing unit that compares the signal output from the Fourier transform unit and the frequency characteristic stored on the characteristic storing unit and computes an error; and a data number adjusting unit that controls the number of insertion data so that the error computed by the error computing unit is within a predetermined range.

The data number adjusting unit may sequentially change the number of insertion data to cause the error computing unit to compute the error every the number of insertion data.

The arithmetic unit may perform the correction arithmetic using the signal output from the Fourier transform unit as the frequency characteristic of the analog-to-digital conversion unit when the error is within the predetermined range.

According to the second aspect of the present invention, there is provided an analog-to-digital conversion apparatus to which an analog signal is divergingly supplied and which corrects digital data output from a plurality of analog-to-digital conversion units that sequentially converts the analog signal in different timing by a predetermined phase. The analog-to-digital conversion apparatus includes: an interleaving unit operable to align the digital data respectively output from the plurality of analog-to-digital conversion units according to the timing in which the digital data are respectively converted and to generate a data sequence; and a correction arithmetic unit operable to correct a data value error of the data sequence caused by a phase error of the timing, in which the plurality of analog-to-digital conversion units samples the analog signal, based on a frequency characteristic of each of the analog-to-digital conversion units, in which the correction arithmetic unit includes: a data partitioning unit that partitions the data sequence into a plurality of partition data having a predetermined partition data number and respectively generates the partition data so that duplicated data of a predetermined number at the head of each of the partition data is overlapped with duplicated data of the predetermined number at the end of the partition data in front of that partition data; an arithmetic unit that sequentially acquires the partition data respectively generated from the data partitioning unit and sequentially outputs data after correction made by sequentially performing correction arithmetic according to the frequency characteristic of each analog-to-digital conversion unit with respect to the acquired partition data; and a data connecting unit that removes either of the duplicated data at the end of each data after correction sequentially output from the arithmetic unit according to each partition data or the duplicated data at the head of that data after correction and sequentially connects the end of that data after correction and the head of the data after correction following that data after correction.

The data partitioning unit may generate the plurality of partition data using the number of process data sequentially acquired by the arithmetic unit as the partition data number.

The correction arithmetic unit may further include: a characteristic storing unit that previously stores a frequency characteristic of the analog-to-digital conversion unit; a Fourier inverse transform unit that converts the frequency characteristic of the analog-to-digital conversion unit into a discrete signal on a time axis and inputs the signal to the data partitioning unit; a Fourier transform unit that converts the signal output from the data connecting unit into a signal on a frequency axis when the Fourier inverse transform unit inputs the discrete signal to the data partitioning unit; an error computing unit that compares the signal output from the Fourier transform unit and the frequency characteristic stored on the characteristic storing unit and computes an error; and a data number adjusting unit that controls the number of insertion data so that the error computed by the error computing unit is within a predetermined range.

According to the third aspect of the present invention, there is provided a program causing an analog-to-digital conversion apparatus, to which an analog signal is divergingly supplied and which corrects digital data output from a plurality of analog-to-digital conversion units that sequentially converts the analog signal in different timing by a predetermined phase, to function. The program causing the analog-to-digital conversion apparatus to function as: an interleaving unit operable to align the digital data respectively output from the plurality of analog-to-digital conversion units according to the timing in which the digital data are respectively converted and to generate a data sequence; and a correction arithmetic unit operable to correct a data value error of the data sequence caused by a phase error of the timing, in which the plurality of analog-to-digital conversion units samples the analog signal, based on a frequency characteristic of each of the analog-to-digital conversion units, in which the program causes the correction arithmetic unit to function as: a data partitioning unit that generates a plurality of partition data by partitioning the data sequence by a predetermined partition data number; a data inserting unit that inserts data with data value zero at the head or end of each of the partition data by a predetermined insertion data number to sequentially output these data; an arithmetic unit that sequentially acquires the partition data sequentially output from the data inserting unit and sequentially outputs data after correction made by sequentially performing correction arithmetic according to the frequency characteristic of each analog-to-digital conversion unit with respect to the acquired partition data; and a data connecting unit that adds the data of the insertion data number at the end of each data after correction sequentially output from the arithmetic unit according to each partition data and the data of the insertion data number at the head of the data after correction following that data after correction in order to sequentially connect that data after correction and the data after correction following that data after correction.

According to the fourth aspect of the present invention, there is provided a program causing an analog-to-digital conversion apparatus, to which an analog signal is divergingly supplied and which corrects digital data output from a plurality of analog-to-digital conversion units that sequentially converts the analog signal in different timing by a predetermined phase, to function. The program causing the analog-to-digital conversion apparatus to function as: an interleaving unit operable to align the digital data respectively output from the plurality of analog-to-digital conversion units according to the timing in which the digital data are respectively converted and to generate a data sequence; and a correction arithmetic unit operable to correct a data value error of the data sequence caused by a phase error of the timing, in which the plurality of analog-to-digital conversion units samples the analog signal, based on a frequency characteristic of each of the analog-to-digital conversion units, in which the program causes the correction arithmetic unit to function as: a data partitioning unit that partitions the data sequence into a plurality of partition data having a predetermined partition data number and respectively generates the partition data so that duplicated data of a predetermined number at the head of each of the partition data is overlapped with duplicated data of the predetermined number at the end of the partition data in front of that partition data; an arithmetic unit that sequentially acquires the partition data respectively generated from the data partitioning unit and sequentially outputs data after correction made by sequentially performing correction arithmetic according to the frequency characteristic of each analog-to-digital conversion unit with respect to the acquired partition data; and a data connecting unit that removes either of the duplicated data at the end of each data after correction sequentially output from the arithmetic unit according to each partition data or the duplicated data at the head of that data after correction and sequentially connects the end of that data after correction and the head of the data after correction following that data after correction.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
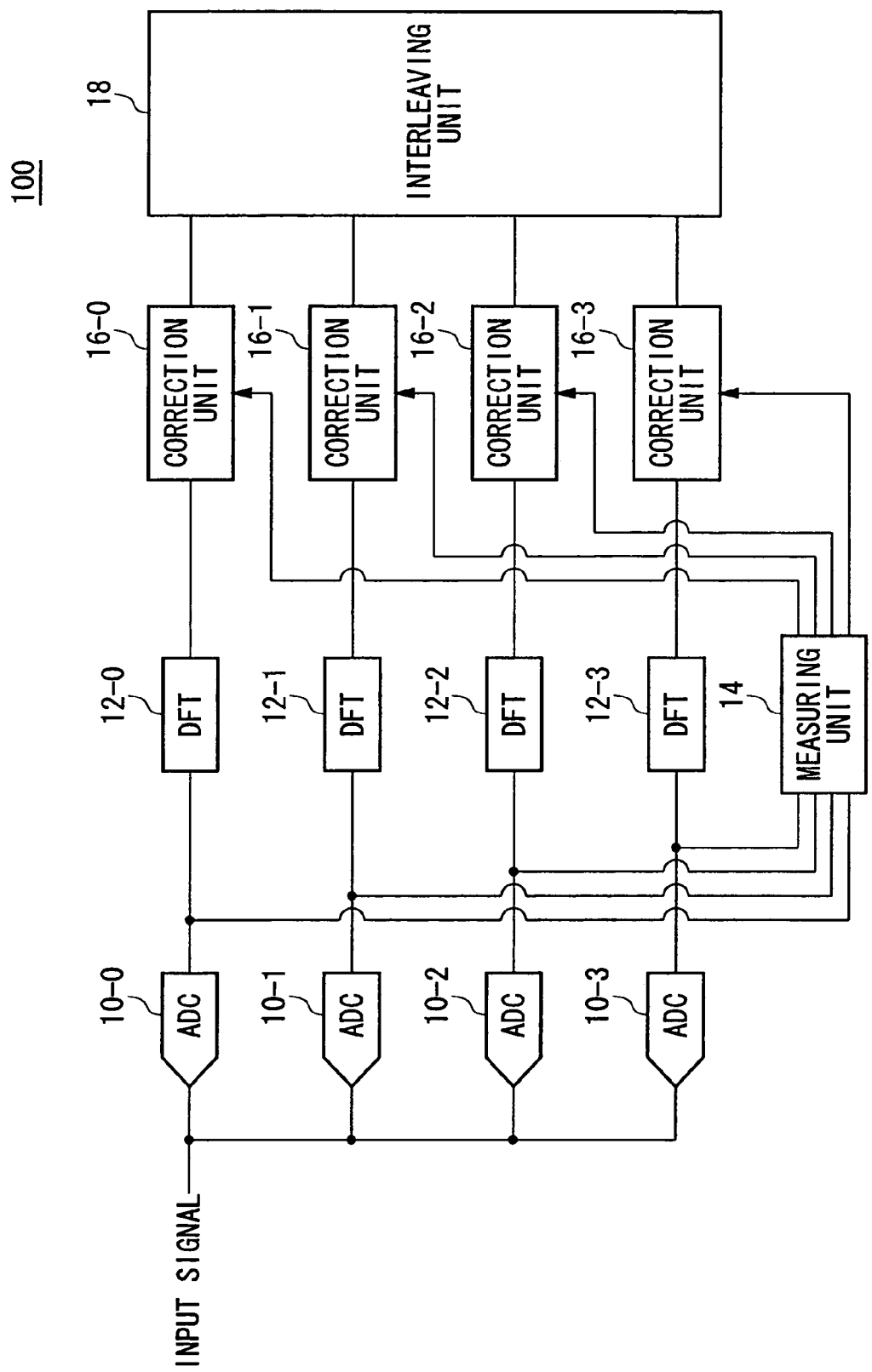
FIG. 1 is a view exemplary showing a configuration of an analog-to-digital conversion apparatus 100.

FIG. 1 is a view exemplary showing a configuration of an analog-to-digital conversion apparatus 100. The analog-to-digital conversion apparatus 100 is a device that converts an analog signal provided as an input signal into a digital signal, and includes a plurality of ADCs 10-0 to 10-3 (hereinafter, generally referred to as ADC 10), a plurality of Fourier transform units 12-0 to 12-3 (hereinafter, generally referred to as Fourier transform unit 12), a plurality of correction units 16-0 to 16-3 (hereinafter, generally referred to as correction unit 16), a measuring unit 14, and an interleaving unit 18. Moreover, in this example, although the analog-to-digital conversion apparatus 100 converts analog signals into digital form by means of four ADCs 10, the number of ADCs 10 is not limited to four. For example, the analog-to-digital conversion apparatus 100 may convert analog signals into digital signals by means of $2^n$ pieces (here, n is one or more integer number) of ADC 10. Even in this case, since the analog-to-digital conversion apparatus 100 realizes an operation similar to the analog-to-digital conversion apparatus 100 in this example, it is possible to compute a frequency spectrum of digital signals with high precision.

Sampling clocks having phases different from one another by a predetermined phase are respectively supplied to the ADCs 10. The supplied sampling clocks will be described below referring to FIG. 2. Then, analog signals are supplied to the ADCs 10 as input signals, and are sampled according to the sampling clocks.

The Fourier transform units 12 are respectively provided corresponding to the ADCs 10, respectively perform Fourier transform on data output from the plurality of ADCs 10 by sampling the analog signals, and generate a plurality of frequency domain signals corresponding to the plurality of ADCs 10. The Fourier transform unit 12 performs Fourier transform, e.g., by discrete Fourier transform.

The measuring unit 14 previously measures a frequency characteristic of each of the ADCs 10. For example, the measuring unit 14 makes each of the ADCs 10 input a known analog signal and measures a frequency characteristic of each of the ADCs 10 based on data output from the ADCs 10. At this time, the measuring unit 14 may measure a frequency characteristic of each of the ADCs 10 using sampling clocks obtained when the analog signals are converted into the digital signals. In this way, it is possible to measure a frequency characteristic of sampling performed in each of the ADCs 10, which include a phase error of the supplied sampling clock.

The correction unit 16 multiplies each of the frequency domain signals by correction coefficients based on the frequency characteristics of all ADCs 10 to convert the frequency domain signals into ideal frequency domain signals obtained when frequency characteristics of the corresponding ADCs 10 are ideal. At this time, the frequency characteristic of any one of the ADCs 10 is taken as ideal frequency characteristics. In this way, it is possible to generate ideal frequency domain signals in which a spurious component caused by an error of the frequency characteristic of each of the ADCs 10 is removed.

Moreover, the interleaving unit 18 synthesizes the ideal frequency domain signals, and generates a frequency spectrum of the digital signal. By such a configuration, it is possible to obtain a frequency spectrum in which a spurious component caused by the frequency characteristics of sampling performed in the ADCs 10 is removed.

Figure 2:
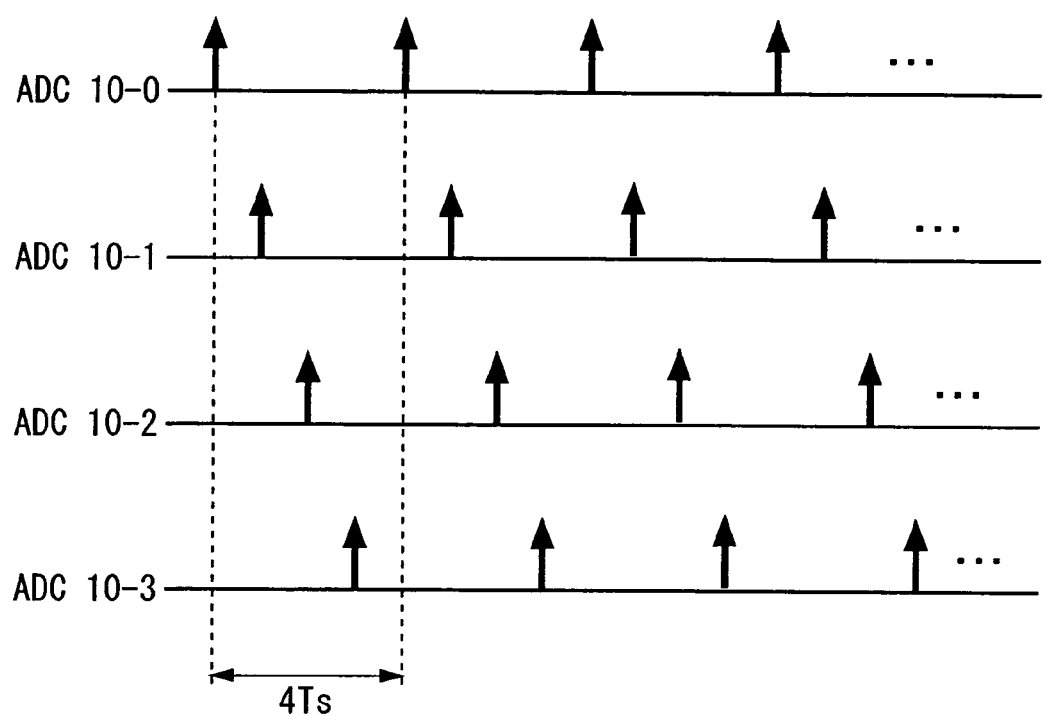
FIG. 2 is a view explaining a sampling clock being supplied to each of the ADCs 10.

FIG. 2 is a view explaining a sampling clock being supplied to each of the ADCs 10. For example, when converting analog signals of [$-1/(2Ts)$, $1/(2Ts)$] band into digital signals, sampling clocks having a frequency of $1/(4Ts)$ are supplied to each of the ADCs 10 in different timing by phase Ts. Since an analog signal is sampled using such a sampling clock, it is possible to sample the analog signal at a rate of four times of a sampling frequency of each of the ADCs 10.

Figure 3:
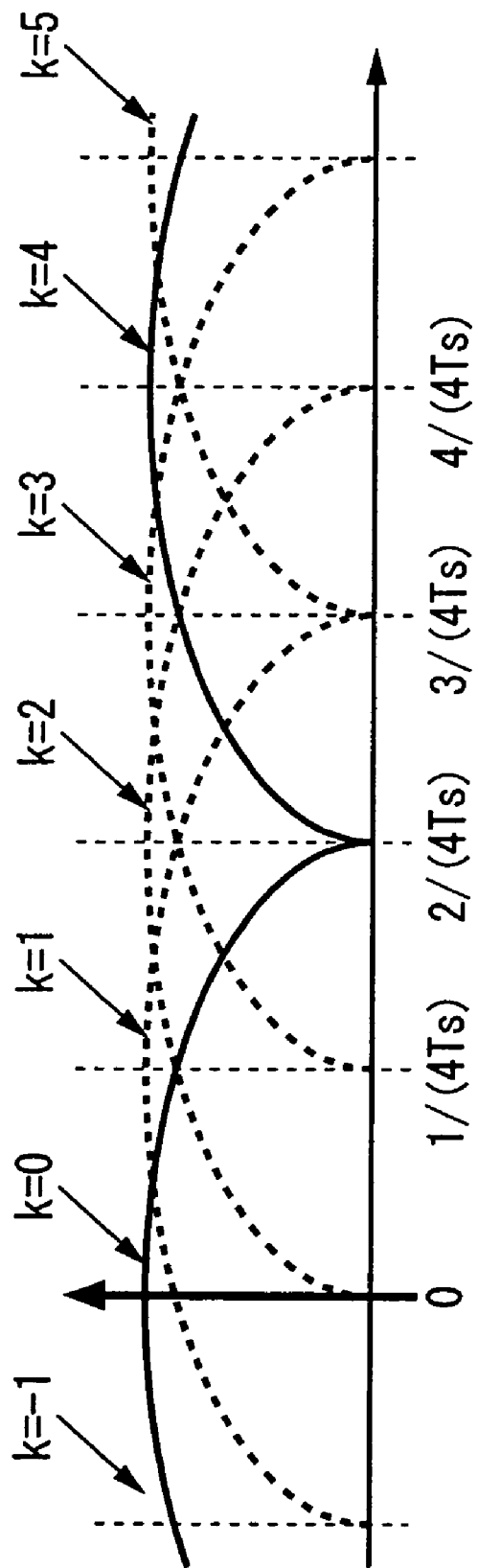
FIG. 3 is a view exemplary showing a frequency characteristic of a signal output from each of Fourier transform units 12.

FIG. 3 is a view exemplary showing a frequency characteristic of a signal output from each of Fourier transform units 12. Spurious components (k=−1, 1, 2, 3, 4, and 5) occur on the frequency domain signal that is made by sampling analog signals in [$-1/(2Ts)$, $1/(2Ts)$] band with $1/(4Ts)$ frequency in addition to a signal component (k=0) as shown by a solid line in FIG. 3. All frequency characteristics have the signal component and the spurious components as shown in FIG. 3. However, since the sampling clocks of the ADCs 10 deviate from one another by Ts, the components of frequency characteristics have directions different from one another in a complex space.

Figure 4:
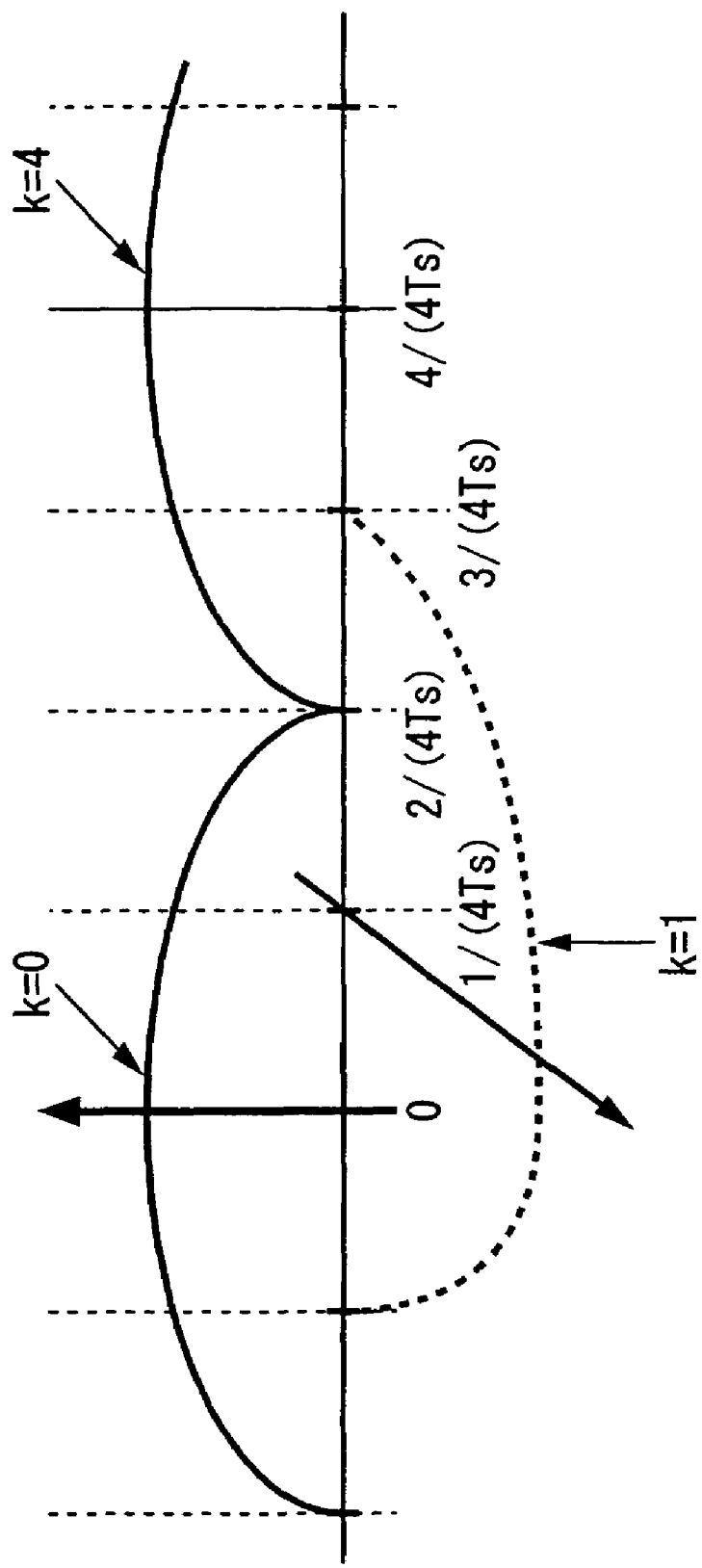
FIG. 4 is a view exemplary showing a part of a frequency characteristic of a signal output from the Fourier transform unit 12-1.

FIG. 4 is a view exemplary showing a part of a frequency characteristic of a signal output from the Fourier transform unit 12-1. Assuming that all components (k=−1 to 5) of the frequency characteristic of a signal output from the Fourier transform unit 12-0 have the same direction in a complex space as shown in FIG. 3, a signal component (k=0) of the frequency characteristic output from the Fourier transform unit 12-1 has the same direction as that of a signal component (see FIG. 3) of the frequency component output from the Fourier transform unit 12-0. However, since a phase of a sampling clock of the ADC 10-1 advances by Ts compared with a phase of a sampling clock of the ADC 10-0, a spurious component (k=1) of the frequency characteristic of the signal output from the Fourier transform unit 12-1 rotates by 90 degrees relative to a signal component (k=0). Similarly, the other spurious components (k=2, 3, 4, 5, not shown) sequentially rotate by 90 degrees.

Figure 5:
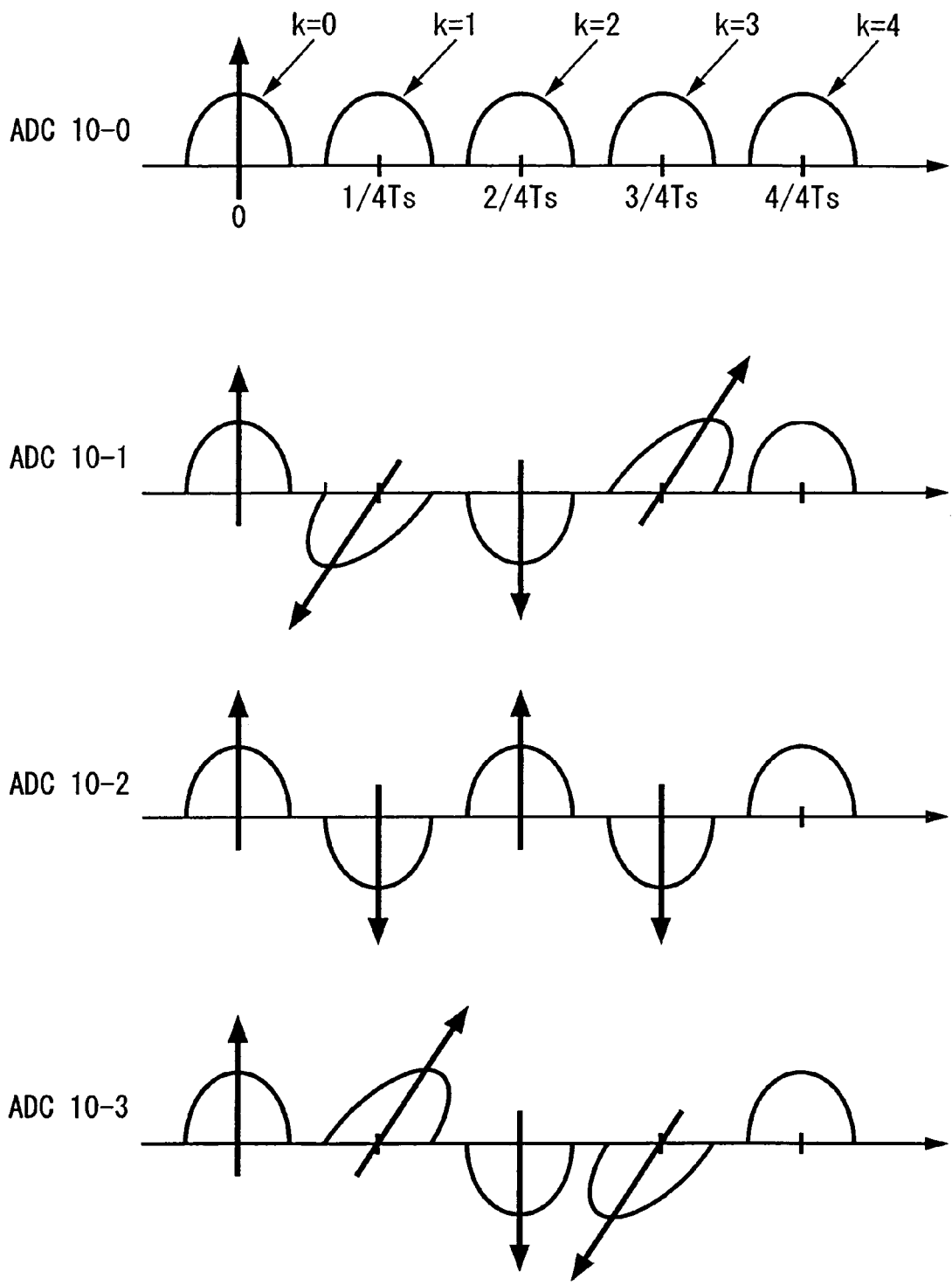
FIG. 5 is a view exemplary in which each of frequency characteristics is displayed on a complex space.

FIG. 5 is a view exemplary in which each of frequency characteristics is displayed on a complex space. Although a signal component and a spurious component are discretely shown in FIG. 5, a signal component and a spurious component may be overlapped like the frequency characteristic shown in FIG. 3.

As described above, a component of the frequency characteristic of the signal output from the Fourier transform unit 12-1 sequentially rotates by 90 degrees. Moreover, since a phase of a sampling clock of the ADC 10-2 advances by 2Ts compared with the phase of the sampling clock of the ADC 10-0, a component of the frequency characteristic of the signal output from the Fourier transform unit 12-2 rotates by 180 degrees as shown in FIG. 5. Similarly, since a phase of a sampling clock of the ADC 10-3 advances by 3Ts compared with the phase of the sampling clock of the ADC 10-0, a component of the frequency characteristic of the signal output from the Fourier transform unit 12-3 rotates by 270 degrees as shown in FIG. 5.

The spurious components (k=−1, 1, 2, 3, 5) of each frequency characteristic are removed by synthesizing these frequency characteristics, only signal component (k=0) and aliasing component (k=4) remain. However, when a variation occurs in sampling timing of the ADC 10 due to a phase error of each sampling clock and a frequency characteristic error of the ADC 10, it is not possible to remove a spurious component by causing a variation in an angle of the spurious component.

Figure 6:
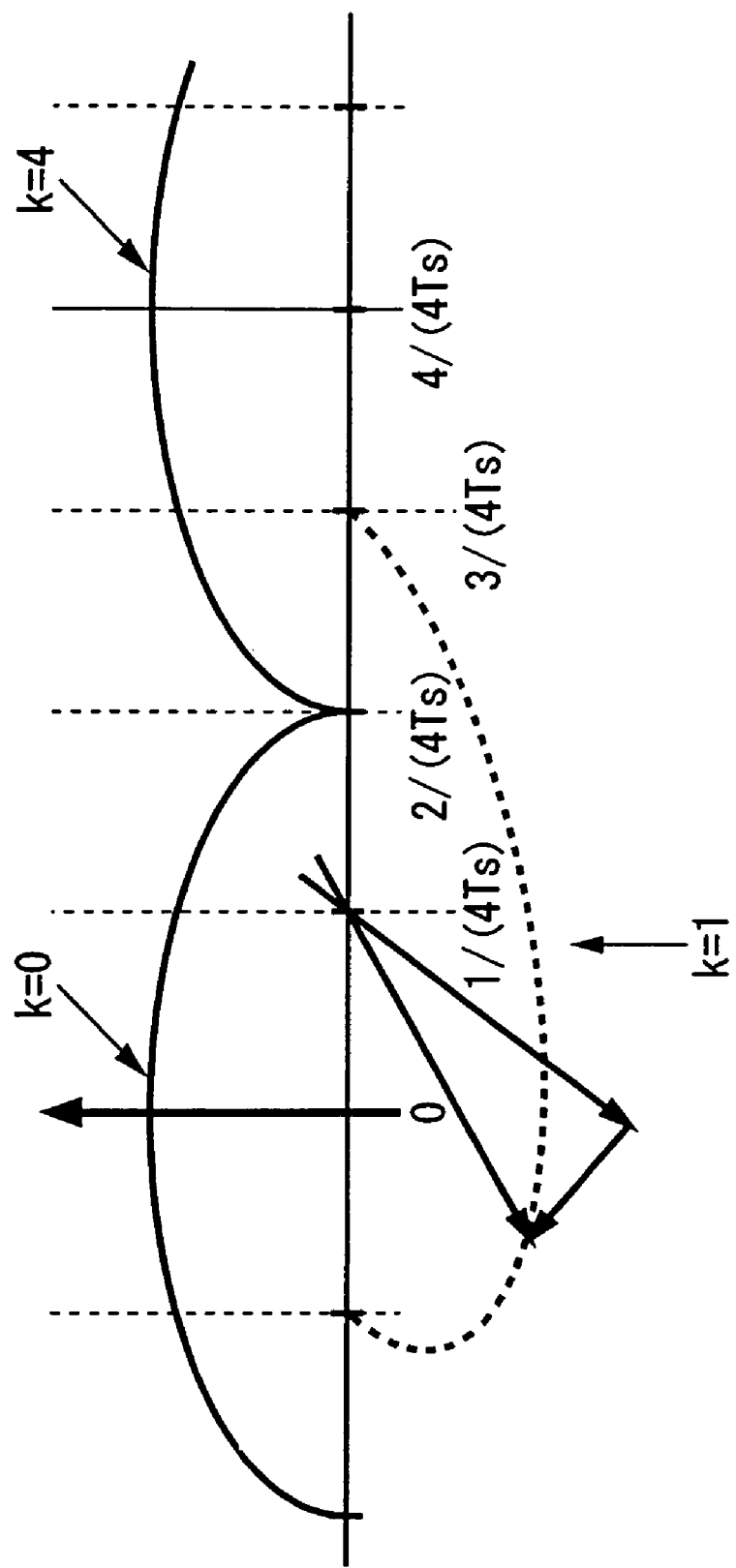
FIG. 6 is a view showing another example of a part of a frequency characteristic of a signal output from the Fourier transform unit 12-1.

FIG. 6 is a view showing another example of a part of a frequency characteristic of a signal output from the Fourier transform unit 12-1. As described above, when there is a phase error in the sampling clock supplied from the ADC 10-1 or the frequency characteristic of the ADC 10-1 is not ideal, as shown in FIG. 6, since a variation occurs in an angle of the spurious component (e.g., k=1) and thus the spurious component is not offset by a spurious component (k=1) of the other frequency characteristic, a spurious component remains when synthesizing all frequency characteristics.

The analog-to-digital conversion apparatus 100 explained in FIG. 1 corrects a variation of an angle of such a spurious component, which is caused by the frequency characteristic of the ADC 10 and the phase error of the sampling clock, to perform interleaving and thus removes a spurious component. An operation of the analog-to-digital conversion apparatus 100 will be described below.

Figure 7:
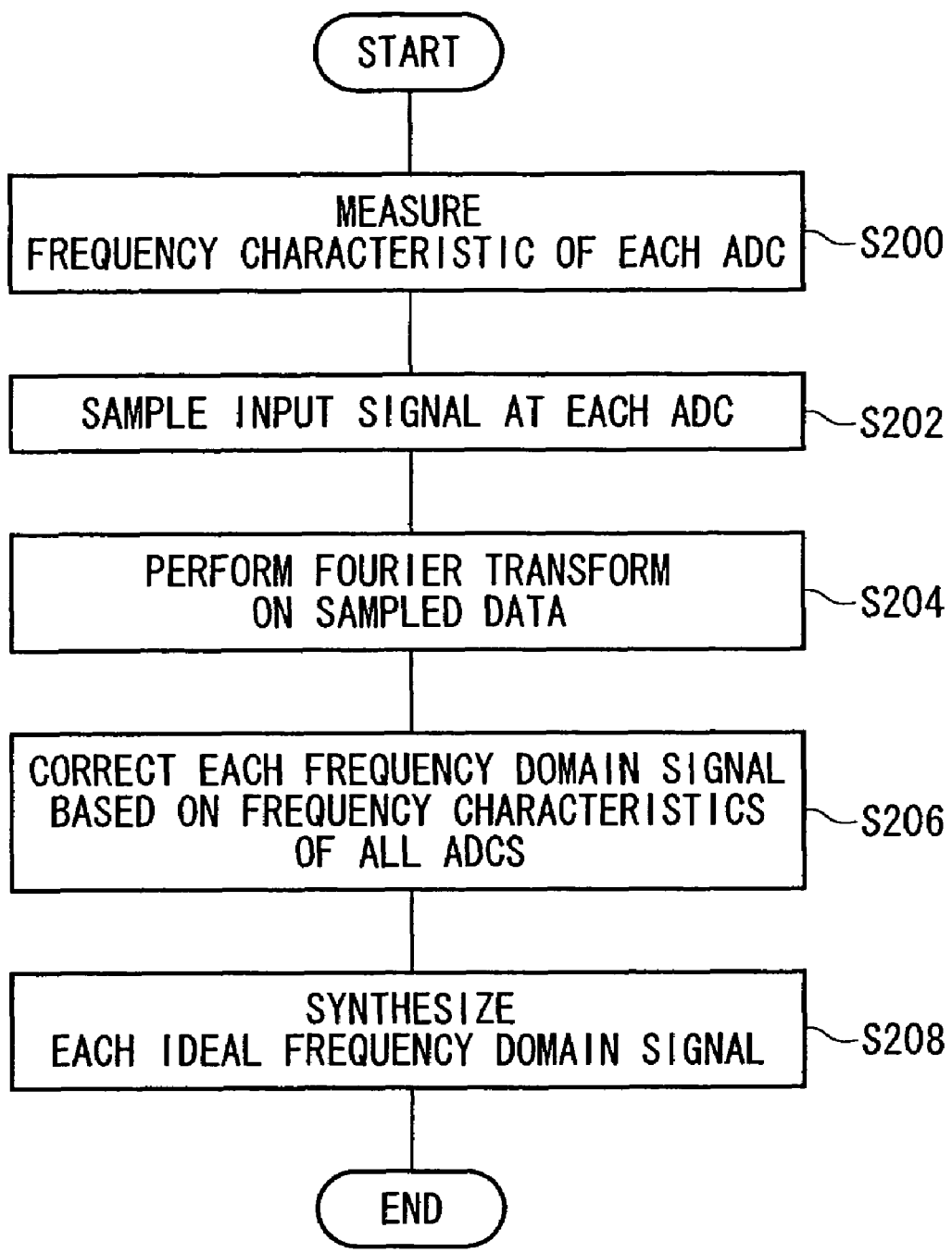
FIG. 7 is a flowchart exemplary showing an operation of an analog-to-digital conversion apparatus 100.

FIG. 7 is a flowchart exemplary showing an operation of an analog-to-digital conversion apparatus 100. At first, in measurement step S200, a measuring unit 10 previously measures a frequency characteristic of each ADC 10. Here, the frequency characteristic of each ADC 10 is given by the following expression.

$$a_l(k) = \frac{1}{4Ts} a\left(f - \frac{k}{4Ts}\right) e^{-j\pi k l/2}$$

Here, l shows the corresponding ADC 10, and l=0, 1, 2, and 3.

Next, in sampling step S202, an analog signal supplied as an input signal is sampled by means of the plurality of ADCs 10. At this time, sampling clocks $p_0(t)$, $p_1(t)$, $p_2(t)$, and $p_3(t)$ supplied to each of the ADCs 10 is given by the following expression.

$$p_0(t) = \sum_{n=-\infty}^{\infty} \delta(t - 4nTs)$$

$$p_1(t) = \sum_{n=-\infty}^{\infty} \delta(t - (4n+1)Ts)$$

$$p_2(t) = \sum_{n=-\infty}^{\infty} \delta(t - (4n+2)Ts)$$

$$p_3(t) = \sum_{n=-\infty}^{\infty} \delta(t - (4n+3)Ts)$$

Expression 1

Next, in Fourier transform step S204, the Fourier transform unit 12 respectively transforms the data sampled by the plurality of ADCs 10 by means of Fourier transform method, and generates a plurality of frequency domain signals corresponding to the plurality of ADCs 10. At this time, the Fourier transform of the sampling clock shown in Expression 1 is given by the following expression.

$$P_l(f) = e^{-j2\pi f(lTs)} \frac{1}{4Ts} \sum_{k=-\infty}^{\infty} \delta\left(f - \frac{k}{4Ts}\right)$$

Expression 2

The frequency domain signal $X_l(f)$ output from each Fourier transform unit 12 is given by the following expression by means of Expression 2.

$$X_l(f) = \frac{1}{4Ts} \sum_{k=-\infty}^{\infty} X\left(f - \frac{k}{4Ts}\right) e^{-j\pi k l/2}$$

Expression 3

Moreover, assuming that $$\bar{x}(k) = \frac{1}{4Ts} X\left(f - \frac{k}{4Ts}\right),$$

each frequency domain signal can be expressed as follows. Here, in this example, the frequency characteristic of the ADC 10-0 is explained as an ideal frequency characteristic. In other words, it is explained as $a_0(k)=1$.

$X_0(f) = \bar{x}(-1) + \bar{x}(0) + \bar{x}(1) + \bar{x}(2) + \bar{x}(3) + \bar{x}(4) + \bar{x}(5)$ $X_1(f) = a_1(-1)\bar{x}(-1) + a_1(0)\bar{x}(0) + a_1(1)\bar{x}(1) + a_1(2)\bar{x}(2) + a_1(3)\bar{x}(3) + a_1(4)\bar{x}(4) + a_1(5)\bar{x}(5)$ $X_2(f) = a_2(-1)\bar{x}(-1) + a_2(0)\bar{x}(0) + a_2(1)\bar{x}(1) + a_2(2)\bar{x}(2) + a_2(3)\bar{x}(3) + a_2(4)\bar{x}(4) + a_2(5)\bar{x}(5)$ $X_3(f) = a_3(-1)\bar{x}(-1) + a_3(0)\bar{x}(0) + a_3(1)\bar{x}(1) + a_3(2)\bar{x}(2) + a_3(3)\bar{x}(3) + a_3(4)\bar{x}(4) + a_3(5)\bar{x}(5)$ Expression 4

Here, fs is sampling frequency of each analog-digital converter, items from k=−1 to 5 show components included in a band [0053] assuming that a band of X(f) is [−2fs, 2fs], and $a_j(k)$ shows a component corresponding to $\bar{x}(k)$ among frequency characteristics of the j-th analog-digital converter.

Next, in correction step S206, the frequency domain signals are multiplied by correction coefficients based on the frequency characteristics of all ADCs 10 using the correction unit 16 in order to be converted into frequency domain signals obtained when the frequency characteristics of the corresponding ADCs 10 is ideal. In this example, in the correction unit 16, the spurious components of k=−1, 1, 2, 3, 5 are removed and a correction coefficient in which only the signal component of k=0 and the aliasing component of that signal component remain is multiplied by each of the frequency characteristics when computing linear sum of frequency components $X_0(f)$ to $X_3(f)$ shown in Expression 4. In other words, the correction coefficients $L_1$, $L_2$, $L_3$ such as Expression 5 are computed, and the correction coefficients are multiplication by each frequency characteristic. Here, α, β are arbitrary real number.

$$X_0(f)+L_1 X_1(f)+L_2 X_2(f)+L_3 X_3(f)=\alpha \bar{x}(0)+\beta \bar{x}(4) \quad \text{Expression 5}$$

At this time, the correction unit 16 divides the frequency band [−2fs, 2fs] of the digital signal to be computed according to the number of ADCs 10. In this example, the correction unit 16 divides the frequency band of the digital signal to be computed into a first region of band [0056], a second region of band [fs, 2fs], a third region of band [0057], and a fourth region of band [0058].

As we know from Expression 4, although the spurious components included in the frequency band [−2fs, 2fs] of the digital signal are four, e.g., k=−1, 1, 2, 3, as clear from Expression 5, there are not correction coefficients $L_1$, $L_2$, $L_3$ to erase four spurious components in the same time. However, each divided region when dividing a frequency band of digital signal like this example has three spurious components as shown in FIG. 3. For this reason, the correction unit 16 can compute each correction coefficient for each frequency band as shown in the following expression.

The first region $$\begin{pmatrix} L_1 \\ L_2 \\ L_3 \end{pmatrix} = \begin{pmatrix} a_1(-1) & a_2(-1) & a_3(-1) \\ a_1(1) & a_2(1) & a_3(1) \\ a_1(2) & a_2(2) & a_3(2) \end{pmatrix}^{-1} \begin{pmatrix} -1 \\ -1 \\ -1 \end{pmatrix} \quad \text{Expression 6}$$

The second region and the third region $$\begin{pmatrix} L_1 \\ L_2 \\ L_3 \end{pmatrix} = \begin{pmatrix} a_1(1) & a_2(1) & a_3(1) \\ a_1(2) & a_2(2) & a_3(2) \\ a_1(3) & a_2(3) & a_3(3) \end{pmatrix}^{-1} \begin{pmatrix} -1 \\ -1 \\ -1 \end{pmatrix} \quad \text{Expression 7}$$

The fourth region $$\begin{pmatrix} L_1 \\ L_2 \\ L_3 \end{pmatrix} = \begin{pmatrix} a_1(2) & a_2(2) & a_3(2) \\ a_1(3) & a_2(3) & a_3(3) \\ a_1(5) & a_2(5) & a_3(5) \end{pmatrix}^{-1} \begin{pmatrix} -1 \\ -1 \\ -1 \end{pmatrix} \quad \text{Expression 8}$$

Then, in synthesizing step S208, the interleaving unit 18 synthesizes each of the frequency domain signals obtained in correction step S206 to generate a frequency spectrum of the digital signal. At this time, since the computed correction coefficients $L_1$, $L_2$, $L_3$ are multiplied by each frequency domain signal in correction step S206, the phases of signal component (k=0) and aliasing component (k=4) are changed. For this reason, in correction step S206, a correction coefficient correcting the change is further computed.

The correction step S206 in this example has a first computation step computing the first correction coefficient and a second computation step computing the second correction coefficient. In the first computation step, each of the first correction coefficients $L_1$, $L_2$, $L_3$ multiplied by each of the frequency domain signals is computed based on the frequency characteristics of all ADCs 10 so that a spurious component of each of the frequency domain signals caused by the frequency characteristic of each of the ADCs 10 is offset. Moreover, in the first computation step, the first correction coefficients $L_{1l}$, $_{L2}$, $L_3$ offsetting a spurious component existing in each region, which is made by dividing the previously described frequency band, among the spurious components of each frequency signal are computed for each divided region.

Moreover, in the second computation step, the second correction coefficients for correcting a phase error of a signal component and an aliasing component of frequency domain signal caused by multiplying the first correction coefficients are computed for each divided region based on each of the first correction coefficients and each of the frequency characteristics. Since only signal component (k=0) remains in the first region and the second region, in the first region and the second region $1/(1+a_1(0)L_1+a_2(0)L_2+a_3(0)L_3)$ is computed as the second correction coefficient. Moreover, since only aliasing component (k=4) remains in the third region and the fourth region, $1/(1+a_1(4)L_1+a_2(4)L_2+a_3(4)L_3)$ is computed as the second correction coefficient.

Then, in synthesizing step S208, the result that is made by synthesizing each of the frequency domain signals obtained in correction step S206 is multiplied by the previously described second correction coefficient. Moreover, in this example, although the second correction coefficient is multiplied in synthesizing step S208, in another example, the second correction coefficient may be multiplied in correction step S206. In other words, in correction step S206, the corresponding first correction coefficient and the corresponding second correction coefficient are multiplied by each frequency domain signal.

As described above, in synthesizing step S208, a frequency spectrum of digital signal is computed for each region based on the following expression.

The first region and the second region $$X'(f) = \frac{1}{1+a_1(0)L_1+a_2(0)L_2+a_3(0)L_3} \quad \text{Expression 9}$$

$$\{X_0(f)+L_1 X_1(f)+L_2 X_2(f)+L_3 X_3(f)\}$$

The third region and the fourth region $$X'(f) = \frac{1}{1+a_1(4)L_1+a_2(4)L_2+a_3(4)L_3} \quad \text{Expression 10}$$

$$\{X_0(f)+L_1 X_1(f)+L_2 X_2(f)+L_3 X_3(f)\}$$

In other words, in synthesizing step S208, a frequency spectrum in the first region is computed by using the correction coefficients $L_1$, $L_2$, $L_3$ computed by Expression 6 in Expression 9. Moreover, a frequency spectrum in the second region is computed by using the correction coefficients $L_1$, $L_2$, $L_3$ computed by Expression 7 in Expression 9, a frequency spectrum in the third region is computed by using the correction coefficients $L_1$, $L_2$, $L_3$ computed by Expression 7 in Expression 10, and a frequency spectrum in the fourth region is computed by using the correction coefficients $L_1$, $L_2$, $L_3$ computed by Expression 8 in Expression 10. By such an operation, it is possible to obtain a frequency spectrum in which a spurious component is removed.

Moreover, in this example, the frequency characteristic of ADC 10-0 is explained as ideal frequency characteristic. However, although the frequency characteristic of ADC 10-0 is not ideal but has a certain frequency characteristic, it is possible to remove a spurious component by correcting the signals based on this frequency characteristic.

In this case, assuming that the result obtained by dividing the frequency characteristic of other ADC 10 by the frequency characteristic of ADC 10-0 is the frequency characteristic $a_1(k)$ of the other ADC 10, it is possible to correct the signal. In other words, assuming that the previously measured frequency characteristics of ADC 10-1 (1=0, 1, 2, 3) are respectively Fad(1), each frequency characteristic $a_1(k)$ used to correct the signal is expressed by the following expressions.

$a_0(k) = Fad(0)$ $a_1(k) = Fad(1)/Fad(0)$ $a_2(k) = Fad(2)/Fad(0)$ $a_3(k) = Fad(3)/Fad(0)$  Expression 11

Moreover, using the frequency characteristics shown in Expression 11, Expression 9 and Expression 10 are expressed by the following expressions.

$$X'(f) = \frac{1}{a_0(0)} \cdot \frac{1}{1 + a_1(0)L_1 + a_2(0)L_2 + a_3(0)L_3} \quad \text{Expression 9}$$
$$\{X_0(f) + L_1 X_1(f) + L_2 X_2(f) + L_3 X_3(f)\}$$

$$X'(f) = \frac{1}{a_0(4)} \cdot \frac{1}{1 + a_1(4)L_1 + a_2(4)L_2 + a_3(4)L_3} \quad \text{Expression 10}$$
$$\{X_0(f) + L_1 X_1(f) + L_2 X_2(f) + L_3 X_3(f)\}$$

Hereinbefore, a given analog signal has been explained as a complex signal. However, when a given analog signal is a real signal, only an operation corresponding to the first region and the second region is applied among the correction methods. For example, in synthesizing step S208, the frequency spectrums in the first region and the second region are computed by using the correction coefficient computed by Expression 6 or Expression 7 in Expression 9, and the complex conjugate of the frequency spectrums in the first region and the second region is computed as the frequency spectrums in the third region and the fourth region.

Moreover, although a band of the computed frequency spectrum has been explained as [0070] in this example, it is possible to realize a similar operation even in case of using the band as [−2fs, 2fs]. For example, it is possible to remove a spurious component in a similar operation by regarding the band of the third region as [−fs, 0] and the band of the fourth region as [−2fs, −fs].

Moreover, each frequency characteristic may be computed as follows on the basis of the frequency characteristic $a(0)$ of k=0.

$a(-1)$: shift $a(0)$ by $-fs/4$ $a(1)$: shift $a(0)$ by $fs/4$ $a(2)$: shift $a(0)$ by $2fs/4$ $a(3)$: shift $a(0)$ by $3fs/4$ $a(5)$: shift $a(0)$ by $5fs/4$ Moreover, when the Fourier transform unit 12 performs Fourier transform by means of discrete Fourier transform, the discrete Fourier transform of each output signal of ADCs 10 is given by the following expression.

$$DFT_0(k) = \sum_{n=0}^{(N/4)-1} x(4nTs)e^{-j2\pi kn/\frac{N}{4}} \quad \text{Expression 12}$$

$$DFT_1(k) = \sum_{n=0}^{(N/4)-1} x((4n+1)Ts)e^{-j2\pi kn/\frac{N}{4}}$$

$$DFT_2(k) = \sum_{n=0}^{(N/4)-1} x((4n+2)Ts)e^{-j2\pi kn/\frac{N}{4}}$$

$$DFT_3(k) = \sum_{n=0}^{(N/4)-1} x((4n+3)Ts)e^{-j2\pi kn/\frac{N}{4}}$$

Then, the frequency domain signal transformed by the discrete Fourier transform method is given by the following expression.

$$X_l\left(\frac{k}{NTs}\right) = \sum_{n=0}^{(N/4)-1} x((4n+l)Ts)e^{-j2\pi f((4n+l)Ts)}$$

$$= e^{-j2\pi kl/N} \sum_{n=0}^{(N/4)-1} x((4n+l)Ts)e^{-j2\pi kn/\frac{N}{4}}$$

$$= e^{-j2\pi kl/N} DFT_l(k)$$

For this reason, Expression 9 and Expression 10 are expressed as follows.

$$X'\left(\frac{k}{NTs}\right) = \frac{1}{1 + a_1(0)L_1 + a_2(0)L_2 + a_3(0)L_3} \quad \text{Expression 9'}$$
$$(DFT_0(k) + L_1 \cdot e^{-j2\pi k \cdot 1/N} \cdot DFT_1(k) +$$
$$L_2 \cdot e^{-j2\pi k \cdot 2/N} \cdot DFT_2(k) + L_3 \cdot$$
$$e^{-j2\pi k \cdot 3/N} \cdot DFT_3(k))$$

$$X'\left(\frac{k}{NTs}\right) = \frac{1}{1 + a_1(4)L_1 + a_2(4)L_2 + a_3(4)L_3} \quad \text{Expression 10'}$$
$$(DFT_0(k) + L_1 \cdot e^{-j2\pi k \cdot 1/N} \cdot DFT_1(k) +$$
$$L_2 \cdot e^{-j2\pi k \cdot 2/N} \cdot DFT_2(k) + L_3 \cdot$$
$$e^{-j2\pi k \cdot 3/N} \cdot DFT_3(k))$$

Moreover, it has been explained that the number of ADCs 10 is four. However, although the number of ADCs 10 is N (N is two or more integer number), it is possible to compute the frequency spectrum in which a spurious component is removed. For example, Expression 4, Expression 5, Expression 9, and Expression 10 are expressed by the following expressions.

$X_0(f) = \bar{x}(-l) + \bar{x}(-l+1) + \Lambda + \bar{x}(m-1) + \bar{x}(m)$ $X_1(f) = a_1(-l)\bar{x}(-l) + a_1(-l+1)\bar{x}(-l+1) + \Lambda + a_1(m-1)\bar{x}(m)$
Mps $X_{N-1}(f) = a_{N-1}(-l)\bar{x}(-l) + a_{N-1}(-l+1)$
$\bar{x}(-l+1) + \Lambda + a_{N-1}(m-1)\bar{x}(m)$  Expression 4'

(Here, in the above expression, assuming that the band of X(f) is [−Nfs/2, Nfs/2] (fs is sampling frequency of each analog-digital converter), terms from −1 to m are components included in the band [0076], and $a_j(k)$ shows a component corresponding to $\bar{x}(k)$ among the frequency characteristics of the j-th analog-digital converter).

$$X_0(f) + L_1 X_1(f) + L_2 X_2(f) + \Lambda + L_{N-1} X_{N-1}(f) = \alpha \bar{x}(0) + \beta \bar{x}(u) \quad \text{Expression 5'}$$

(Here, in the above expression, $\alpha$ and $\beta$ are arbitrary real number, and x(u) is an aliasing component of x(0).)

$$X'(f) = \frac{1}{1 + a_1(0)L_1 + a_2(0)L_2 + \Lambda + a_{N-1}(0)L_{N-1}} \quad \text{Expression 9''}$$
$$\{X_0(f) + L_1 X_1(f) + L_2 X_2(f) + \Lambda + L_{N-1} X_{N-1}(f)\}$$

$$X'(f) = \frac{1}{1 + a_1(u)L_1 + a_2(u)L_2 + \Lambda + a_{N-1}(u)L_{N-1}} \quad \text{Expression 10''}$$
$$\{X_0(f) + L_1 X_1(f) + L_2 X_2(f) + \Lambda + L_{N-1} X_{N-1}(f)\}$$

Figure 8:
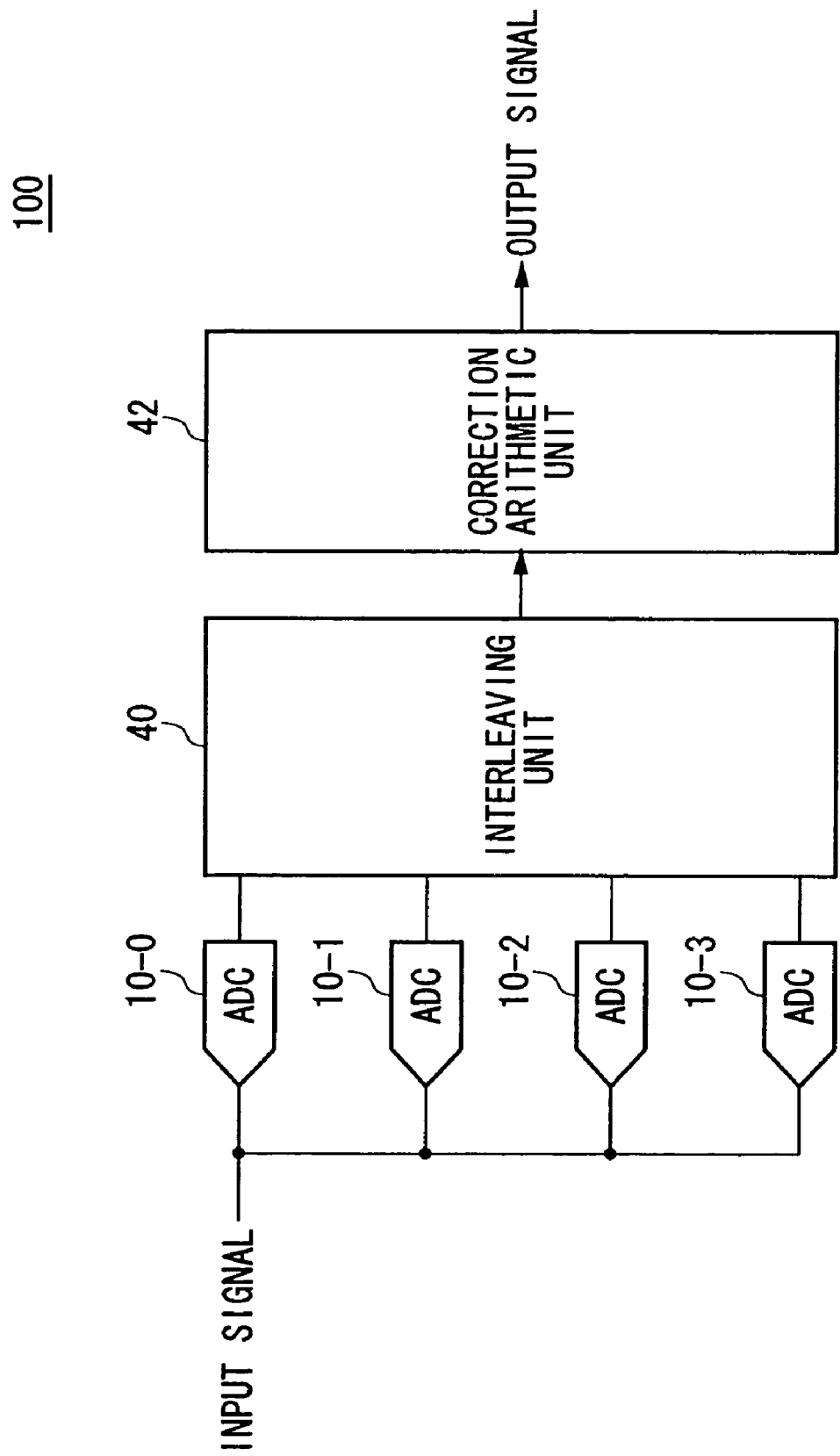
FIG. 8 is a view showing another example of a configuration of the analog-to-digital conversion apparatus 100.

FIG. 8 is a view showing another example of a configuration of the analog-to-digital conversion apparatus 100. The analog-to-digital conversion apparatus 100 according to this example holds a continuity of a waveform of the digital data output from the plurality of ADCs 10 to perform discrete Fourier transform and correction arithmetic. The analog-to-digital conversion apparatus 100 includes a plurality of ADCs 10, an interleaving unit 40, and a correction arithmetic unit 42.

In this example, it will be described about the analog-to-digital conversion apparatus 100 having four ADCs 10. However, although the analog-to-digital conversion apparatus 100 includes N ADCs 10, it is possible to perform similar correction.

Moreover, the analog-to-digital conversion apparatus 100 may not include the ADCs 10, but receive the digital data output from outside ADCs 10. In this case, the analog-to-digital conversion apparatus 100 may use, e.g., a FPGA (Field Programmable Gate Array).

The plurality of ADCs 10 has the same function as that of the ADCs 10 explained using FIGS. 1 to 7. The plurality of ADCs 10 divergingly receives an input signal (an analog signal) respectively and converts the analog signal into digital data in different timing by a predetermined phase.

The interleaving unit 40 aligns the digital data respectively output from the plurality of ADCs 10 according to the timing in which each digital data is converted to generate a data sequence. For example, the interleaving unit 40 may be a FIFO memory that sequentially stores and outputs data received from the plurality of ADCs 10.

The correction arithmetic unit 42 corrects a data value error of the data sequence caused by a phase error of the timing in which the plurality of ADCs 10 samples the analog signal based on a frequency characteristic of each of the ADCs 10. The correction arithmetic unit 42 performs the similar arithmetic process to that of the Fourier transform unit 12 and the correction unit 16 explained using FIGS. 1 to 7 while holding a continuity of a waveform of the data sequence.

Figure 9:
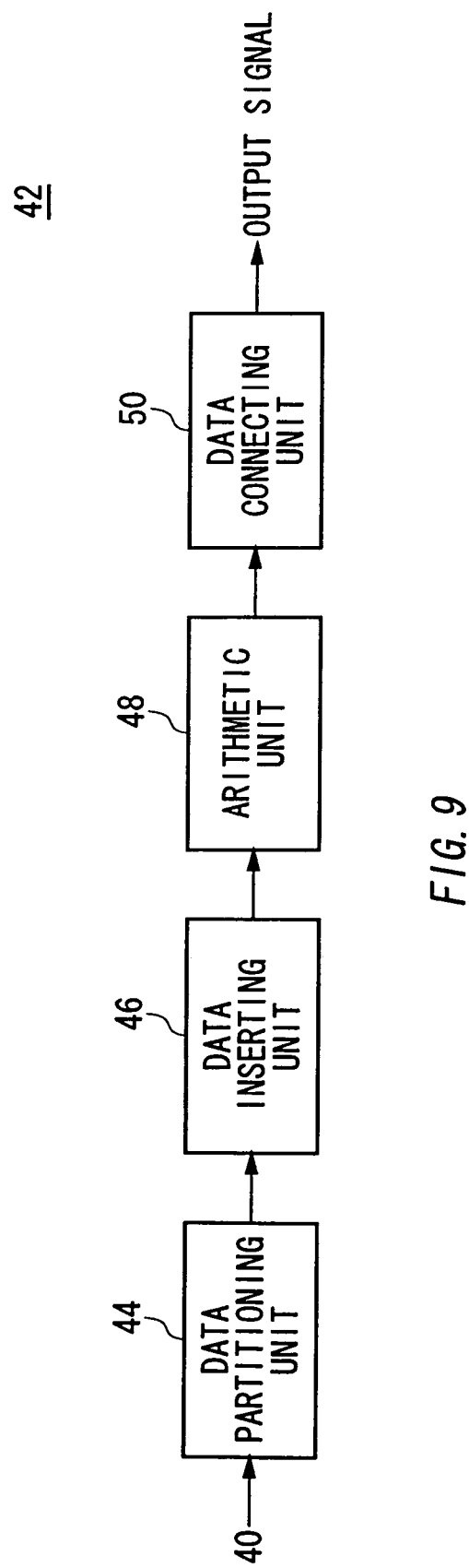
FIG. 9 is a view exemplary showing a configuration of the correction arithmetic unit 42.

FIG. 9 is a view exemplary showing a configuration of the correction arithmetic unit 42. The correction arithmetic unit 42 has a data partitioning unit 44, a data inserting unit 46, an arithmetic unit 48, and a data connecting unit 50. An operation of each unit will be explained by means of FIG. 10.

Figure 10:
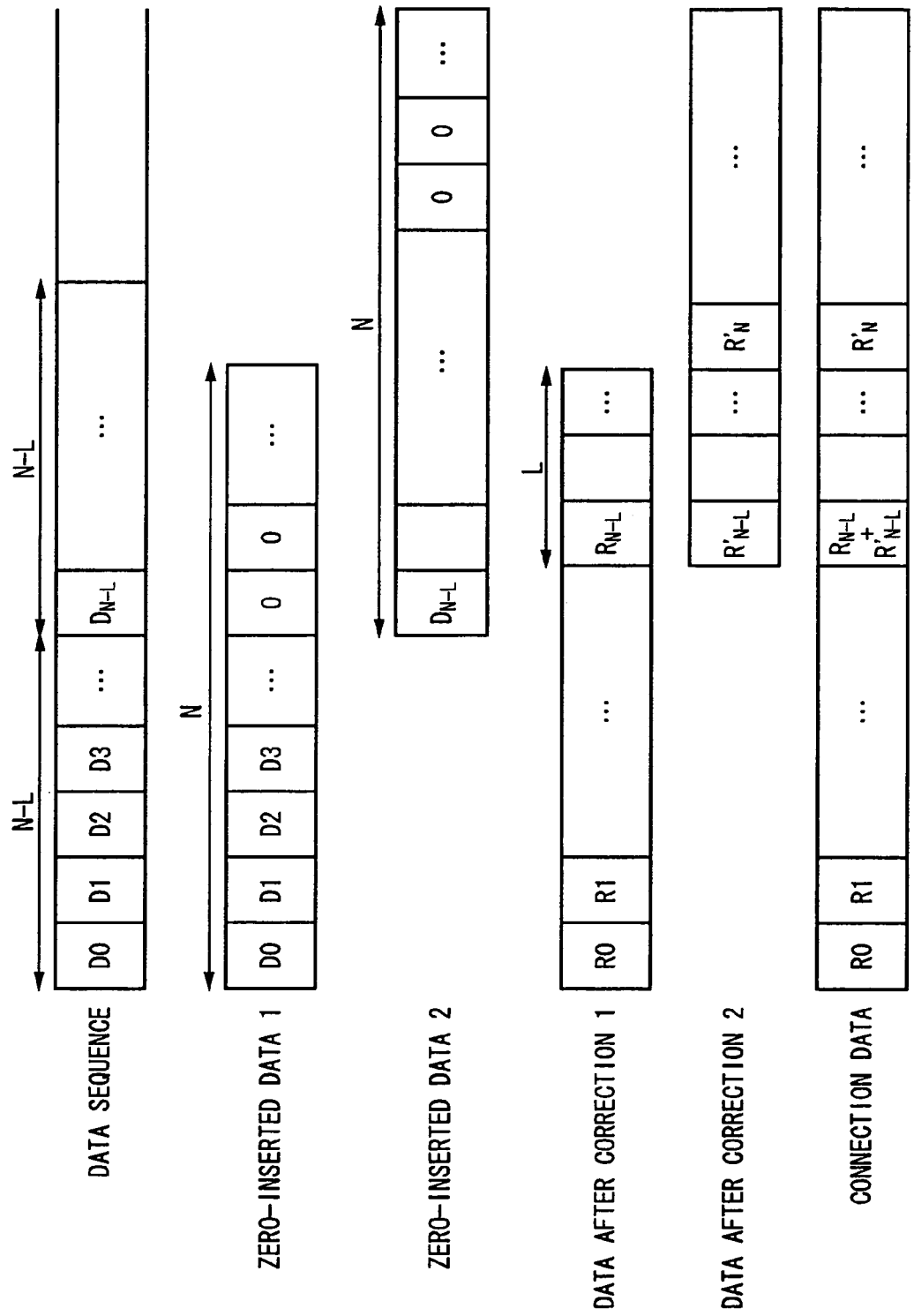
FIG. 10 is a view exemplary explaining an operation of the correction arithmetic unit 42.

FIG. 10 is a view exemplary explaining an operation of the correction arithmetic unit 42. The data partitioning unit 44 receives a data sequence, and generates a plurality of partition data by dividing the received data sequence by a predetermined partition data number N-L (N and L are natural number). Here, N shows the number of processing data that the arithmetic unit 48 can sequentially acquire. For example, when the arithmetic unit 48 performs fast Fourier transform, N is a power-of-two number. Moreover, L is a predetermined value.

The data inserting unit 46 sequentially outputs zero-inserted data that are made by inserting data with data value zero at the head or end of each partition data by the predetermined insertion data number L. That is, the number of data of the zero-inserted data is equal with the process data number N that the arithmetic unit 48 can acquire. In FIG. 10, the data with data value zero is inserted at the end of the partition data.

The arithmetic unit 48 sequentially acquires the zero-inserted data sequentially output from the data inserting unit 46, and sequentially outputs data after correction made by sequentially performing correction arithmetic according to the frequency characteristic of each ADC 10 with respect to the acquired zero-inserted data. The arithmetic unit 48 has the plurality of Fourier transform units 12, the plurality of correction units 16, and the interleaving unit 18 described related to FIG. 1, and outputs the data after correction made by performing correction described using FIGS. 1 to 7 with respect to the data corresponding to each of the ADCs 10. The arithmetic unit 48 may have a means for dividing the zero-inserted data into the data corresponding to each of the ADCs 10 in order to perform correction arithmetic with respect to the data corresponding to each of the ADCs 10. The divided data are input to the corresponding Fourier transform unit 12.

The data connecting unit 50 adds the data of the insertion data number L at the end of each data after correction sequentially output from the arithmetic unit 48 and the data of the insertion data number L at the head of the data after correction output from the arithmetic unit 48 following that data after correction in order to sequentially connect each data after correction and the next data after correction. For example, when connecting data after correction 1 and data after correction 2, data from the head data $R_0$ to the data $R_{N-L-1}$ of the data after correction 1 are held. Then, the data of the insertion data number L at the end of data after correction 1 and the data of the insertion data number L at the head of data after correction 2 are added to be connected to the data $R_{N-L-1}$. Then, the data after the L+1th from the head of data after correction 2 are further connected.

By such a configuration, it is possible to improve a continuity of a waveform in correction arithmetic.

Figure 11:
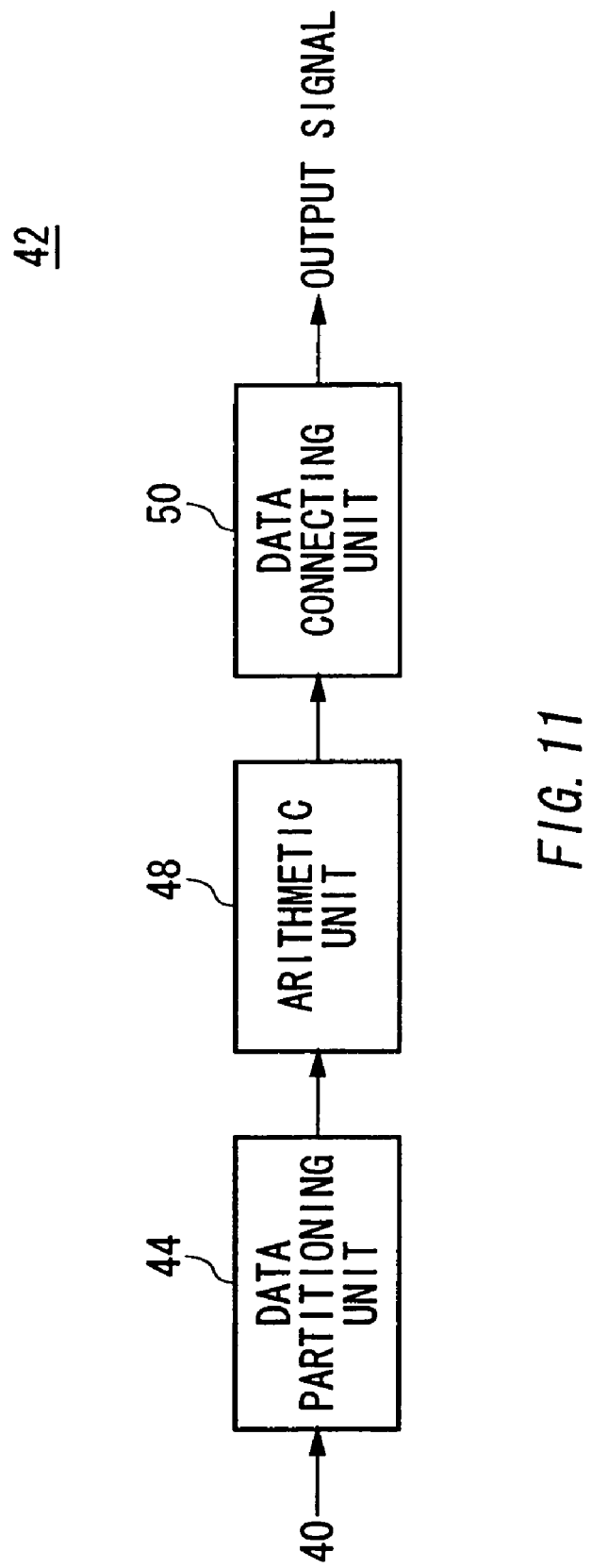
FIG. 11 is a view showing another example of a configuration of the correction arithmetic unit 42.

FIG. 11 is a view showing another example of a configuration of the correction arithmetic unit 42. The correction arithmetic unit 42 has a data partitioning unit 44, an arithmetic unit 48, and a data connecting unit 50. An operation of each unit will be explained by means of FIG. 12.

Figure 12:
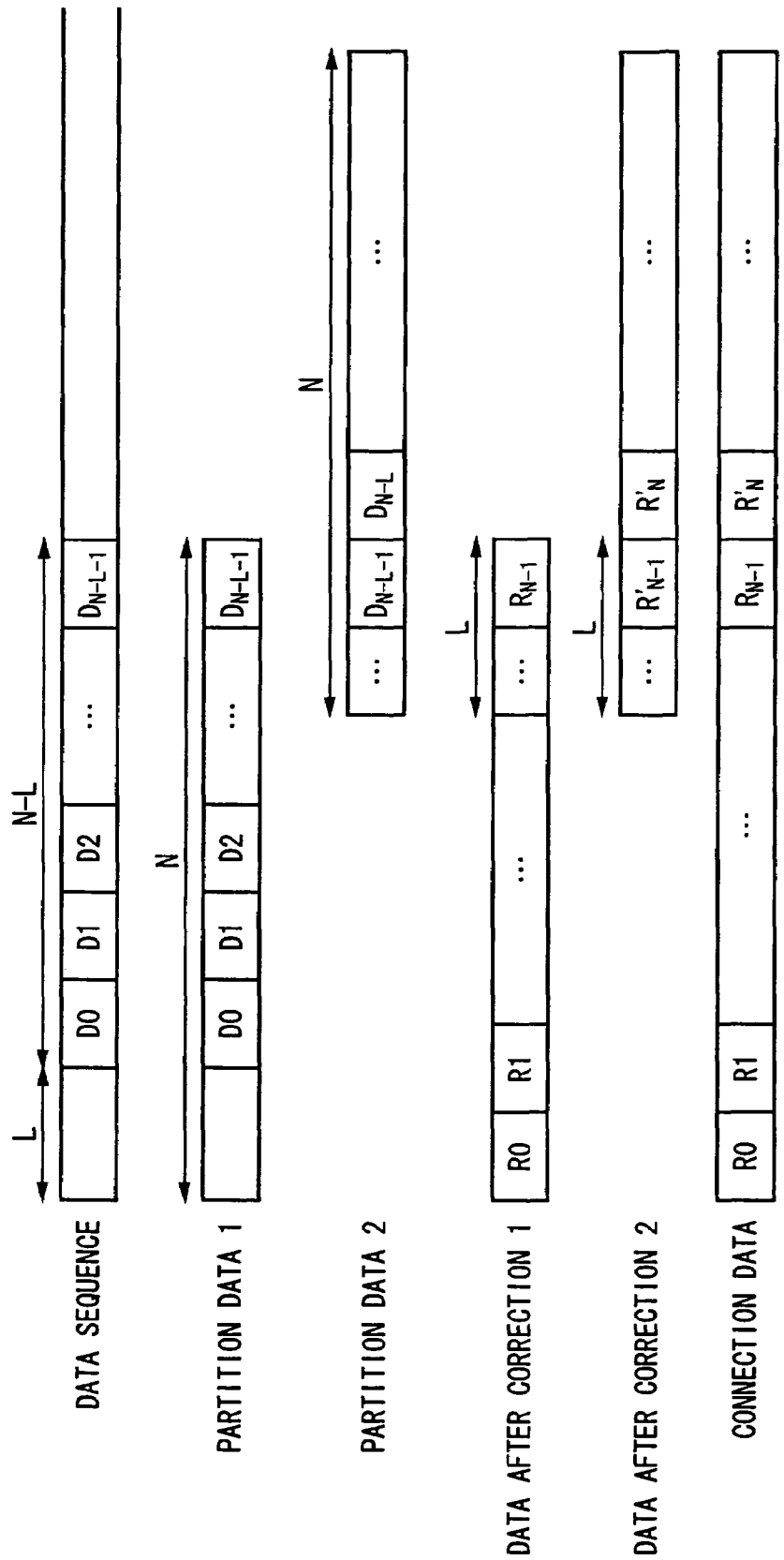
FIG. 12 is a view exemplary explaining an operation of the correction arithmetic unit 42 shown in FIG. 11.

FIG. 12 is a view exemplary explaining an operation of the correction arithmetic unit 42 shown in FIG. 11. The data partitioning unit 44 receives a data sequence, and divides the received data sequence into a plurality of partition data respectively having data of a predetermined data number N. Here, the data number N of the partition data is equal with the number of process data that the arithmetic unit 48 can sequentially acquire.

At this time, the data partitioning unit 44 generates each partition data so that data of a predetermined duplicated data number L at the head of each partition data are overlapped with data of the duplicated data number L at the end of partition data in front of that partition data. Moreover, about the head partition data, since the partition data in front of that partition data does not exist, data with data value zero may be inserted at the head of that partition data by L. For example, the data partitioning unit 44 extracts a data stream having N-L data from the head of the data sequence, and generates data made by inserting L zero data at the head of that data stream as partition data 1. Moreover, the data partitioning unit 44 extracts a data stream having N data from the data sequence to generate the stream as partition data 2 so that the L data at the head of partition data 2 are overlapped with the L data at the end of partition data 1.

The arithmetic unit 48 sequentially acquires the partition data sequentially output from the data partitioning unit 44, and sequentially outputs data after correction made by sequentially performing correction arithmetic according to a frequency characteristic of each ADC 10 with respect to the acquired partition data. The arithmetic unit 48 has the same configuration and function as those of the arithmetic unit 48 explained using FIGS. 9 and 10.

The data connecting unit removes either of the duplicated data at the end of each data after correction sequentially output from the arithmetic unit 48 according to each partition data or the duplicated data at the head of that data after correction, and sequentially connects the end of that data after correction and the head of the data after correction following that data after correction. For example, when connecting the data after correction 1 and the data after correction 2, the L data at the head of each of the data after correction 1 and the data after correction 2 may be removed. Then, the end of the data after correction 1 from which the data have been removed and the head of the data after correction 2 from which the data have been removed are connected.

By such a configuration, it is possible to improve a continuity of a waveform in correction arithmetic.

Figure 13:
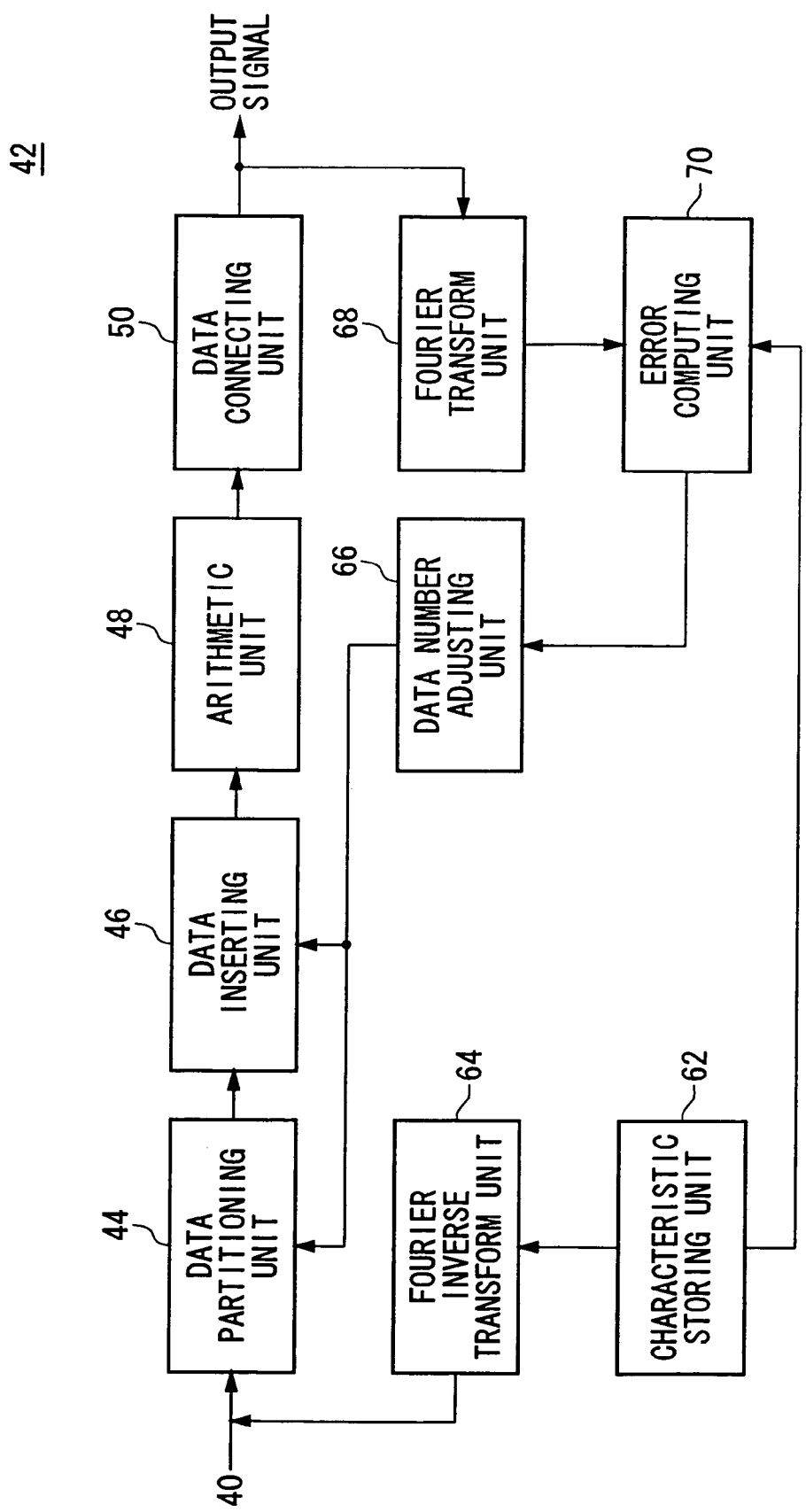
FIG. 13 is a view showing another example of a configuration of the correction arithmetic unit 42.

FIG. 13 is a view showing another example of a configuration of the correction arithmetic unit 42. The correction arithmetic unit 42 according to this example further has a characteristic storing unit 62, a Fourier inverse transform unit 64, a data number adjusting unit 66, a Fourier transform unit 68, and an error computing unit 70 in addition to a configuration of the correction arithmetic unit 42 shown in FIG. 9. The correction arithmetic unit 42 in this example holds a continuity of a waveform in regard to an operation of the arithmetic unit 48 by adjusting the insertion data number with respect to the correction arithmetic unit 42 explained related to FIG. 9.

The characteristic storing unit 62 previously stores a frequency characteristic of ADC 10. Here, the frequency characteristic of ADC 10 may be measured by means of the measuring unit 14 explained using FIG. 1. Moreover, the characteristic storing unit 62 may store a frequency characteristic of either of the plurality of ADCs 10.

The Fourier inverse transform unit 64 converts the frequency characteristic of ADC 10 stored on the characteristic storing unit 62 in to a discrete signal on a time axis. The Fourier inverse transform unit 64 inputs the discrete signal to the data partitioning unit 44. At this time, the interleaving unit 40 does not input the sequence data to the data partitioning unit 44.

The data partitioning unit 44, the data inserting unit 46, the arithmetic unit 48, and the data connecting unit 50 performs the same process as that described using FIG. 10 with respect to the discrete signal. Moreover, the arithmetic unit 48 may not perform correction arithmetic with respect to the discrete signal.

The Fourier transform unit 68 converts the signals output from the data connecting unit 50 according to the discrete signal into signals in a frequency domain. The error computing unit 70 compares the signals in the frequency domain converted by the Fourier transform unit 68 and the frequency characteristic stored on the characteristic storing unit 62 in order to compute an error. The error computing unit 70 may compute a squared error of these signals.

The data number adjusting unit 66 adjusts the insertion data number in the data partitioning unit 44 and the data inserting unit 46 so that the error computed by the error computing unit 70 is within a predetermined range. For example, the data number adjusting unit 66 sequentially changes the insertion data number to cause the error computing unit 70 to compute an error with respect to each insertion data number. Then, the data number adjusting unit 66 detects the smallest insertion data number among the insertion data number in which the error is within the predetermined range. The data number adjusting unit 66 causes the data partitioning unit 44 and the data inserting unit 46 to process the data sequence provided from the interleaving unit 40 using the detected insertion data number.

By such a configuration, it is possible to set the insertion data number such that a continuity of a waveform of the data sequence can be held in arithmetic process of the arithmetic unit 48.

Moreover, the arithmetic unit 48 may perform correction arithmetic corresponding to the set insertion data number using the frequency characteristic output from the Fourier transform unit 68. In this case, the characteristic storing unit 62 stores a frequency characteristic of each ADC 10. Moreover, the error computing unit 70 computes an error for each frequency characteristic of each ADC 10, and the data number adjusting unit 66 detects the insertion data number in which all errors of frequency characteristic of all the ADCs 10 are within the predetermined range.

Figure 14:
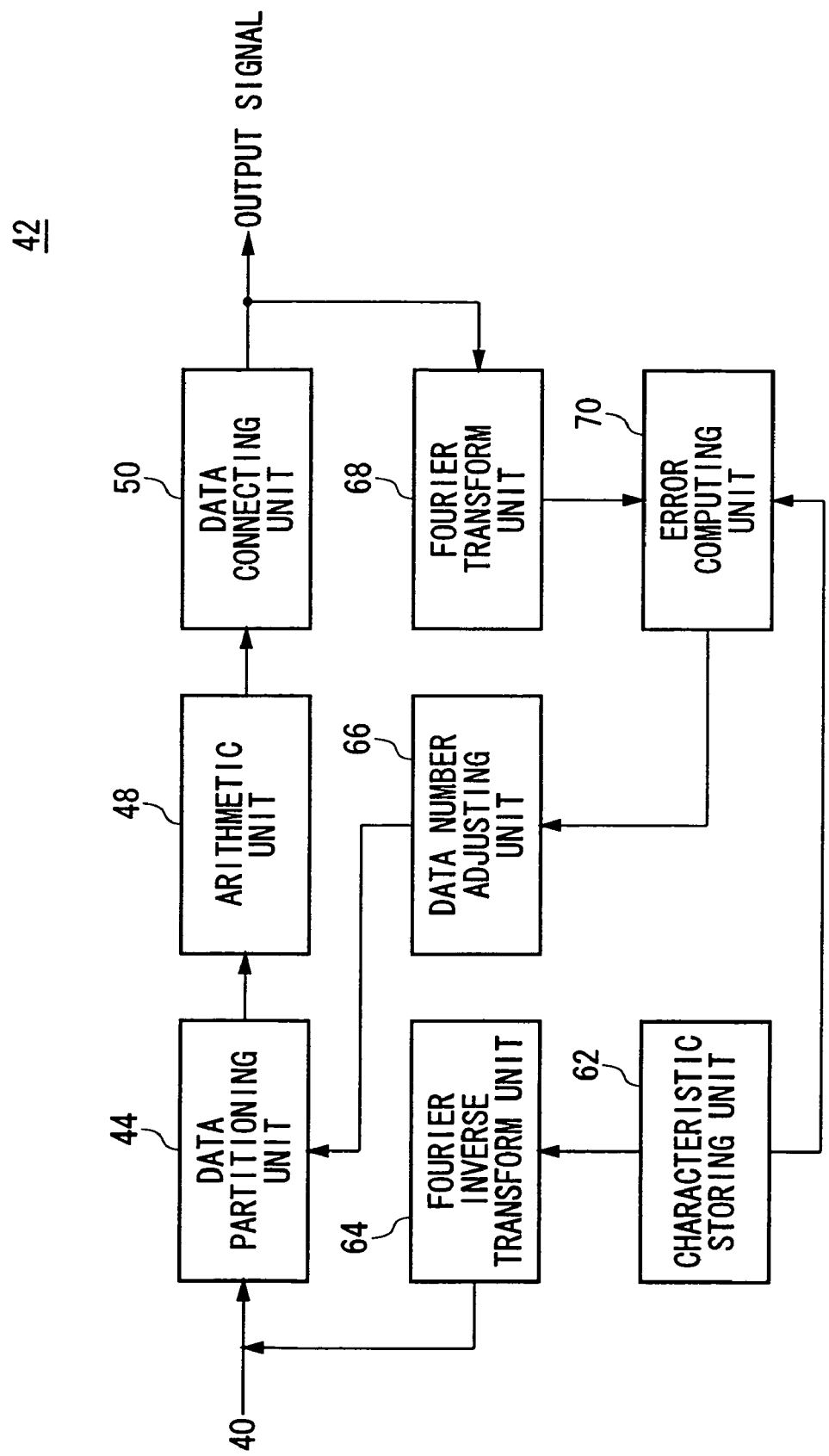
FIG. 14 is a view showing another example of a configuration of the correction arithmetic unit 42.

FIG. 14 is a view showing another example of a configuration of the correction arithmetic unit 42. The correction arithmetic unit 42 according to this example further has a characteristic storing unit 62, a Fourier inverse transform unit 64, a data number adjusting unit 66, a Fourier transform unit 68, and an error computing unit 70 in addition to a configuration of the correction arithmetic unit 42 shown in FIG. 11. The correction arithmetic unit 42 in this example holds a continuity of a waveform in regard to an operation of the arithmetic unit 48 by adjusting the duplicated data number with respect to the correction arithmetic unit 42 explained related to FIG. 11.

In this example, the operations of the characteristic storing unit 62, the Fourier inverse transform unit 64, the data number adjusting unit 66, the Fourier transform unit 68, and the error computing unit 70 are similar to those described in FIG. 13. However, the data number adjusting unit 66 adjusts the duplicated data number in the data partitioning unit 44.

By such a configuration, it is possible to set the insertion data number such that a continuity of a waveform of the data sequence can be held in arithmetic process of the arithmetic unit 48.

Figure 15:
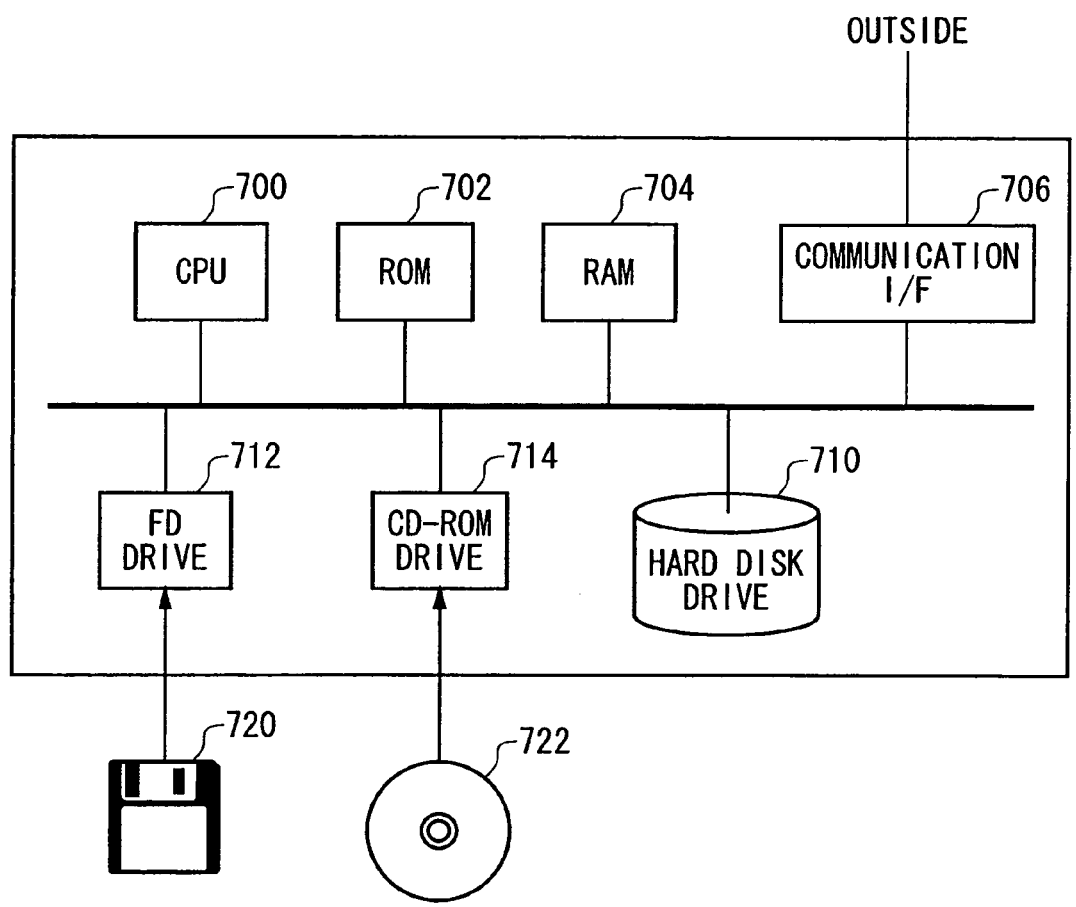
FIG. 15 is a view exemplary showing a configuration of a computer 400 that stores a program causing the analog-to-digital conversion apparatus 100 to function.

FIG. 15 is a view exemplary showing a configuration of a computer 400 that stores a program causing the analog-to-digital conversion apparatus 100 to function. In this example, the computer 400 stores a program making the analog-to-digital conversion apparatus 100 function as described in FIGS. 1 to 14. The computer 400 may be a workstation controlling the analog-to-digital conversion apparatus 100, or may function as the correction arithmetic unit 42.

The computer 400 includes a CPU 700, a ROM 702, a RAM 704, a communication interface 706, a hard disk drive 710, a FD drive 712, and a CD-ROM drive 714. The CPU 700 operates based on a program stored on the ROM 702, the RAM 704, the hard disk 710, the FD disk 720, and/or the CD-ROM 722.

The communication interface 706 communicates with, e.g., the analog-to-digital conversion apparatus 100 to send and receive data. The hard disk drive 710 as an example of a storing unit stores setting information and a program to cause the central processing unit 700 to operate. The ROM 702, the RAM 704, and the hard disk drive 710 store a program causing the analog-to-digital conversion apparatus 100 to function as the analog-to-digital conversion apparatus 100 described related to FIGS. 1 to 14. Moreover, the program may be stored on the flexible disk 720, the CD-ROM 722, the hard disk drive 710, etc.

The FD drive 712 reads the program from the flexible disk 720 and provides it to the CPU 700. The CD-ROM drive 714 reads the program from the CD-ROM 722 and provides it to the CPU 700.

Moreover, the program may be read from a recording medium and stored on a RAM to be executed, or may be read from a recording medium to be once installed in a hard disk drive and stored on a RAM to be executed. Furthermore, the program may be stored on single recording medium, or may be stored on a plurality of recording media. Moreover, a program stored on the recording medium may provide each of the functions in association with an operating system. For example, a program may request an execution of all or some of the functions to an operating system, and provide the function based on an answer from the operating system.

It is possible to use an optical recording medium such as a DVD and a PD, a magneto-optical recording medium such as an MD, a tape medium, a magnetic recording medium, an IC card, and a semiconductor memory such as a miniature card besides a flexible disk and a CD-ROM as a recording medium storing a program. Moreover, a storing unit such as a hard disk or a RAM that is provided in a server system connected to a private telecommunication network, an Internet, etc. may be used as a recording medium.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to divide digital data sampled using a plurality of ADCs provided in parallel and hold a continuity of a waveform of the digital data when performing correction arithmetic in a frequency domain in order to perform the correction arithmetic.

What is claimed is:

1. An analog-to-digital apparatus to which an analog signal is divergingly supplied and which corrects digital data output from a plurality of analog-to-digital conversion units that sequentially converts the analog signal in different timing by a predetermined phase, the analog-to-digital conversion apparatus comprising:

an interleaving unit operable to align the digital data respectively output from the plurality of analog-to-digital conversion units according to the timing in which the digital data are respectively converted and to generate a data sequence; and a correction arithmetic unit operable to correct a data value error of the data sequence caused by an error of a frequency characteristic for each of the plurality of analog-to-digital conversion units, based on said frequency characteristics of each of the analog-to-digital conversion units, wherein said correction arithmetic unit comprises:

a data partitioning unit that partitions the data sequence into a plurality of partition data having a predetermined partition data number and respectively generates the partition data so that duplicated data of a predetermined number at the head of each of the partition data is overlapped with duplicated data of the predetermined number at the end of the partition data in front of that partition data;

an arithmetic unit that sequentially acquires the partition data respectively generated from the data partitioning unit and sequentially outputs data after correction made by sequentially performing correction arithmetic according to the frequency characteristic of each analog-to-digital conversion unit with respect to the acquired partition data; and a data connecting unit that removes either of the duplicated data at the end of each data after correction sequentially output from the arithmetic unit according to each partition data or the duplicated data at the head of that data after correction and sequentially connects the end of that data after correction and the head of the data after correction following that data after correction.

2. The analog-to-digital conversion apparatus as claimed in claim 1, wherein the data partitioning unit generates the plurality of partition data using the number of process data sequentially acquired by the arithmetic unit as the partition data number.

3. The analog-to-digital conversion apparatus as claimed in claim 2, wherein said correction arithmetic unit further comprises:

a characteristic storing unit that previously stores a frequency characteristic of the analog-to-digital conversion unit;

a Fourier inverse transform unit that converts the frequency characteristic of the analog-to-digital conversion unit into a discrete signal on a time axis and inputs the signal to the data partitioning unit;

a Fourier transform unit that converts the signal output from the data connecting unit into a signal on a frequency axis when the Fourier inverse transform unit inputs the discrete signal to the data partitioning unit;

an error computing unit that compares the signal output from the Fourier transform unit and the frequency characteristic stored on the characteristic storing unit and computes an error; and a data number adjusting unit that controls the number of insertion data so that the error computed by the error computing unit is within a predetermined range.

4. A computer readable medium having a program and execute by a processor causing an analog-to-digital conversion apparatus, to which an analog signal is divergingly supplied and which corrects digital data output from a plurality of analog-to-digital conversion units that sequentially converts the analog signal in different timing by a predetermined phase, to function, the program causing the analog-to-digital conversion apparatus to function as:

an interleaving unit operable to align the digital data respectively output from the plurality of analog-to-digital conversion units according to the timing in which the digital data are respectively converted and to generate a data sequence; and a correction arithmetic unit operable to correct a data value error of the data sequence caused by an error of a frequency characteristic for each of the plurality of analog-to-digital conversion units, based on said frequency characteristics of each of the analog-to-digital conversion units an outputting unit operable to output the data corrected by the correction arithmetic unit, wherein the program causes said correction arithmetic unit to function as:

a data partitioning unit that partitions the data sequence into a plurality of partition data having a predetermined partition data number and respectively generates the partition data so that duplicated data of a predetermined number at the head of each of the partition data is overlapped with duplicated data of the predetermined number at the end of the partition data in front of that partition data;

an arithmetic unit that sequentially acquires the partition data respectively generated from the data partitioning unit and sequentially outputs data after correction made by sequentially performing correction arithmetic according to the frequency characteristic of each analog-to-digital conversion unit with respect to the acquired partition data; and a data connecting unit that removes either of the duplicated data at the end of each data after correction sequentially output from the arithmetic unit according to each partition data or the duplicated data at the head of that data after correction and sequentially connects the end of that data after correction and the head of the data after correction following that after correction.

* * * * *